United States Patent
Bovensiepen et al.

(10) Patent No.: US 6,222,740 B1
(45) Date of Patent: *Apr. 24, 2001

(54) MULTILAYER CIRCUIT BOARD HAVING AT LEAST ONE CORE SUBSTRATE ARRANGED THEREIN

(75) Inventors: Kurt Bovensiepen, Winnenden; Helmut Ulmer, Backnang; Gerhard Messarosch, Schwaikheim, all of (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/209,714

(22) Filed: Dec. 11, 1998

(30) Foreign Application Priority Data

Dec. 19, 1997 (DE) ................................ 197 56 818

(51) Int. Cl.⁷ ....................................... H05K 1/03
(52) U.S. Cl. .................. 361/795; 361/792; 428/209; 428/212; 428/220; 428/901; 174/255; 174/260; 29/830
(58) Field of Search .................. 361/719–721, 361/748–751, 792–795; 428/209, 210, 212, 213, 217, 218, 220, 901; 174/255, 260, 256; 29/830, 846

(56) References Cited

U.S. PATENT DOCUMENTS

| | | | |
|---|---|---|---|
| 4,496,793 | * 1/1985 | Hanson et al. | 428/901 |
| 4,609,586 | * 9/1986 | Jensen et al. | 428/209 |
| 4,654,248 | * 3/1987 | Mohammed | 428/137 |
| 4,711,804 | * 12/1987 | Burgess | 428/210 |
| 4,921,054 | 5/1990 | Voss et al. | 174/255 |
| 4,963,414 | * 10/1990 | LeVasseur et al. | 428/901 |
| 4,963,697 | * 10/1990 | Peterson et al. | 29/846 |
| 5,306,571 | * 4/1994 | Dolowy, Jr. et al. | 428/608 |
| 5,374,788 | * 12/1994 | Endoh et al. | 174/266 |
| 5,900,312 | * 5/1999 | Sylvester | 428/901 |

FOREIGN PATENT DOCUMENTS

| | | |
|---|---|---|
| 41 31 717 | 4/1993 | (DE) . |
| 0 393 312 | 2/1990 | (EP) . |

* cited by examiner

Primary Examiner—Hyung-Sub Sough
Assistant Examiner—John B. Vigushin
(74) Attorney, Agent, or Firm—Kenyon & Kenyon

(57) ABSTRACT

A multilayer circuit board includes multiple conductor path planes arranged one above another and separated by insulating material layers. The multilayer circuit board includes at least one electronic component (in particular an LCCC) placed on one of the two outer sides of the multilayer circuit board. The multilayer circuit board includes at least one core substrate arranged in the multilayer circuit board between the outer insulating material layers. The core substrate largely adapts the thermal expansion properties of the multilayer circuit board, at least in the coverage area of the electronic component, to the thermal expansion properties of the component. In order to achieve a reduction in the weight of the multilayer circuit board, an inner layer portion, equipped with a recess, is provided between the two outer insulating material layers. The lateral extent of the recess in the inner layer portion is confined approximately to the coverage area of the electronic component, and the core substrate is introduced into the recess. Advantageously, the inner layer portion can also receive multiple conductor path planes separated by insulating material layers, thus achieving a further reduction in the size of the circuit board.

11 Claims, 2 Drawing Sheets

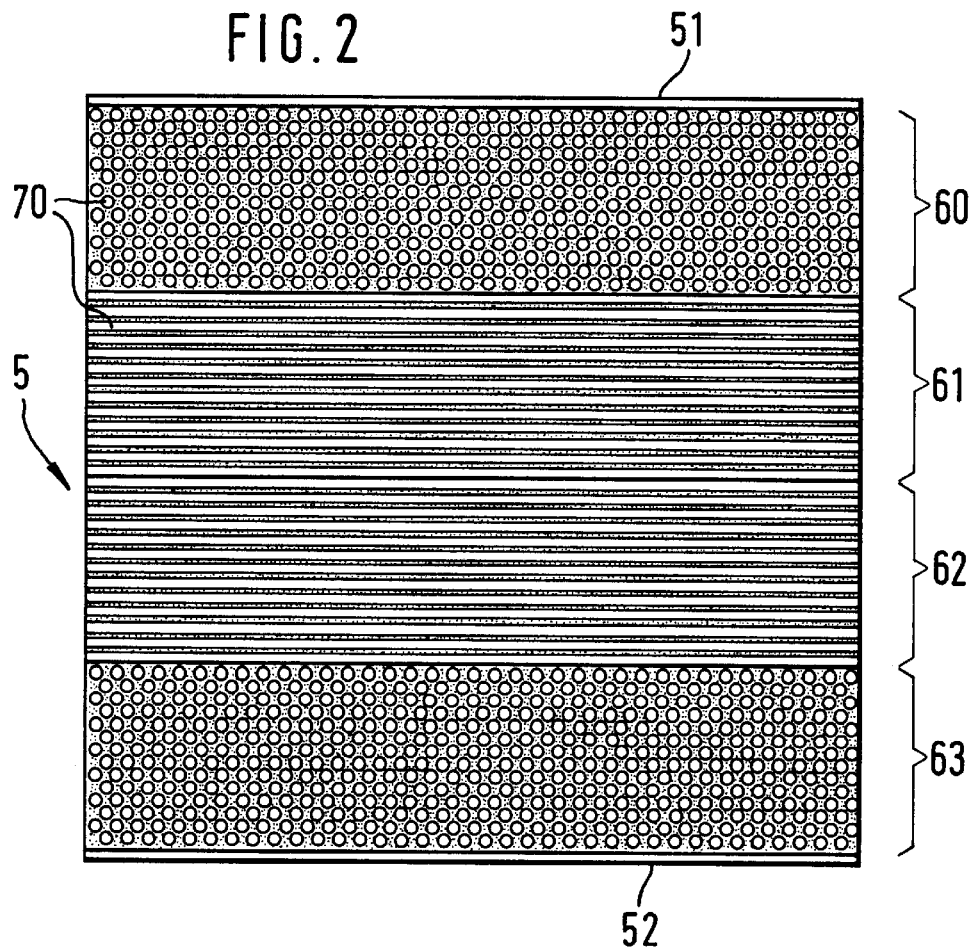
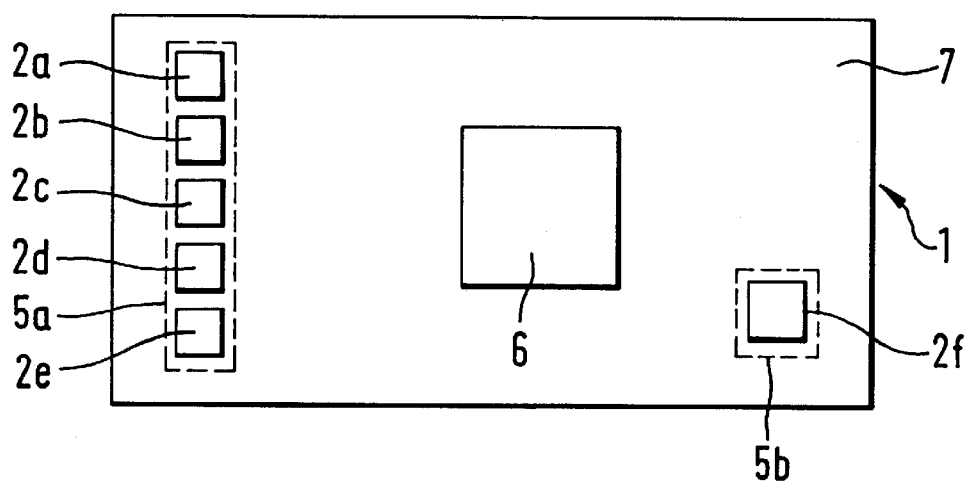

MULTILAYER CIRCUIT BOARD HAVING AT LEAST ONE CORE SUBSTRATE ARRANGED THEREIN

FIELD OF THE INVENTION

The present invention relates to a multilayer circuit board.

BACKGROUND INFORMATION

When populating multilayer circuit boards with electronic components, it is known to solder components without connecting leads, e.g. so-called LCCC (leadless ceramic chip carrier) components, directly onto corresponding connecting surfaces of the multilayer circuit board. When thermal shock loads occur, the different coefficients of thermal expansion of the ceramic chip carriers and the circuit board result in shear forces which must be absorbed by the soldered connections of the component. With severe temperature fluctuations, such as occur in particular in space technology, for example in a satellite orbiting the earth, the difference in thermal expansion between large-area ceramic components and the circuit board would lead to damage to the soldered connections and failure of the assembly. In the case of a satellite located in space, a soldered connection defect of this kind is extremely disastrous, since it generally leads to failure of the unit in question. To solve this problem, it is known to use multilayer circuit boards having a core substrate. Core substrates made of metal or composite carbon fiber materials are known.

U.S. Pat. No. 4,921,054, for example, discloses a thermomechanically adapted multilayer circuit board having two core substrates, made of copper-plated Invar, which control the expansion behavior of the circuit board. The layered composite material made up of the core substrates and circuit board material is produced by stacking and pressing. The coefficient of expansion of the overall arrangement comprising insulating material, conductor path layers, and core substrates are determined by the proportion of the total thickness of the layered composite accounted for by the core substrate. Since the core substrate has a much lower coefficient of thermal expansion than the circuit board material, which as a rule is made of an epoxy/glass material, it is possible for the resulting coefficient of thermal expansion of the multilayer circuit board equipped with the core to be adapted to the coefficients of expansion of the ceramic components. Disadvantageous shear forces which might damage the soldered connection therefore do not occur in the coverage area of the components.

Despite the advantages of the known multilayer circuit boards, producing the through-plated holes guided through the core substrate is extremely complex. A further disadvantage is that the core substrates extending over the entire surface extent of the circuit board greatly increase the weight of the circuit board, which is extremely undesirable in space technology. It is also disadvantageous that the known core substrates increase the size of the multilayer circuit board. Since conductor paths cannot be laid out in the plane of the core substrate, either the thickness of the circuit board must be increased or the circuit board must be enlarged laterally. Both are extremely undesirable, since the space available, especially in space technology, is extremely limited.

SUMMARY OF THE INVENTION

The multilayer circuit board according to the present invention eliminates the drawbacks which occur with the existing art. It is particularly advantageous that in the case of the multilayer circuit board according to the present invention, the at least one core substrate is provided only in the coverage area of the at least one component, and does not cover the entire lateral extent of the circuit board. Because the at least one core substrate is provided only at points which later will actually be populated with ceramic components on the upper or lower side of the circuit board, the weight of the circuit board is greatly reduced as compared to the known multilayer circuit boards having a core substrate which covers the entire extent of the circuit board. This constitutes a substantial advantage especially in space technology. When the multilayer circuit board is produced, the at least one core substrate is simply laid as an insert into a recess provided for it in an inner layer portion of the multilayer circuit board. Further insulating material layers, equipped with conductor paths, are laid onto the inner layer portion. The entire stack is then further processed, in known fashion, to produce a multilayer circuit board. Large-area leadless ceramic chip carriers are soldered on only at those positions on the outer sides of the multilayer circuit board which are located opposite at least one core substrate arranged in the interior of the circuit board. This ensures that the expansion properties of the multilayer circuit board in the coverage area of the ceramic chip carriers are adapted to the thermal expansion properties of those components, so that any damage to the soldered connections in the event of thermal shock loads is avoided.

It is particularly advantageous if the inner layer portion has multiple conductor path planes separated by insulating material layers. Since the at least one core substrate is laid into a recess of the inner layer portion, sufficient room still remains in the frames surrounding this recess to provide further conductor path planes there. The size of the multilayer circuit board can be further reduced as a result, since the conductor paths are at least partially also laid out in the inner layer portion in which the at least one core substrate is arranged. It is furthermore advantageous that through-plated holes which are intended to be guided through the multilayer circuit board do not need to be guided through the core substrate, but rather are simply provided in the portion of the inner layer portion which laterally adjoins the at least one core substrate. The technological outlay for producing the through-plated holes can thereby be greatly reduced as compared to the existing art.

It is furthermore advantageous to introduce the core substrate as an insert, into the recess in the inner layer portion provided therefor, in as accurately fitted a manner as possible.

It is advantageous if the inner layer portion having the at least one core substrate is arranged centeredly between the two outer sides of the multilayer circuit board, so that a symmetrical layer structure results and the thermal expansion coefficients on the upper side and lower side of the circuit board are uniformly adapted to the expansion behavior of the ceramic chip carriers. This prevents different shear forces from acting on the upper side and lower side of the core substrate in response to thermal shock loads, which would result in bending of the multilayer circuit board. A centered arrangement of the inner layer portion also makes possible, in particular with circuit boards populated on both sides, a uniformly good thermomechanical adaptation of the circuit board in the coverage area of components placed on the upper side and on the lower side.

It is also particularly advantageous if the core substrate is made of molybdenum. Molybdenum offers the advantage of possessing a low coefficient of thermal expansion and at the same time a high modulus of elasticity. With the combination of these two properties, on the one hand the thermal expansion behavior of the circuit board is adapted to the coefficients of expansion of the ceramic chip carriers, and on the other hand the molybdenum core is well suited, because of its rigidity, for counteracting shear stresses which occur in the multilayer circuit board as a result of the different expansion behaviors of the circuit board material and core substrate.

It is also advantageous to use a carbon fiber core which includes multiple unidirectional carbon fiber plies arranged in layered fashion above one another. This core substrate advantageously has a lower weight than the cores made of metal. In this context, the carbon fibers contained in the carbon fiber plies and running parallel to one another combine the advantage of a high modulus of elasticity with the advantage of a low coefficient of thermal expansion. It is particularly advantageous if the carbon fiber core comprises a total of four unidirectional carbon fiber plies of identical thickness, which are arranged so that the carbon fibers in the two center plies run parallel to one another, and in the two outer carbon fiber plies are oriented perpendicular to the carbon fibers in the two center carbon fiber plies. The advantageous result of this arrangement is that shear forces acting on the core substrate do not cause any bending or bulging of the core, and the planarity of the core is maintained even if temperatures change.

It is also advantageous that a metal coating, preferably made of copper, is applied onto the outer sides of the core substrate. It is particularly advantageous if the metal coatings are made of black-oxidized copper coatings, since these coatings possess particularly high adhesion and shear strength, thus preventing any cracking or detachment of the core substrate from the insulating material layers applied onto the outer sides of the core substrate in the event of thermal shock loads.

BRIEF DESCRIPTION OF THE DRAWINGS

FIG. 2 shows a second exemplary embodiment of a multilayer circuit board according to the present invention having a carbon fiber core.

FIG. 3 schematically shows a plan view of a multilayer circuit board having the core substrate according to the present invention.

DETAILED DESCRIPTION

Figure 1:
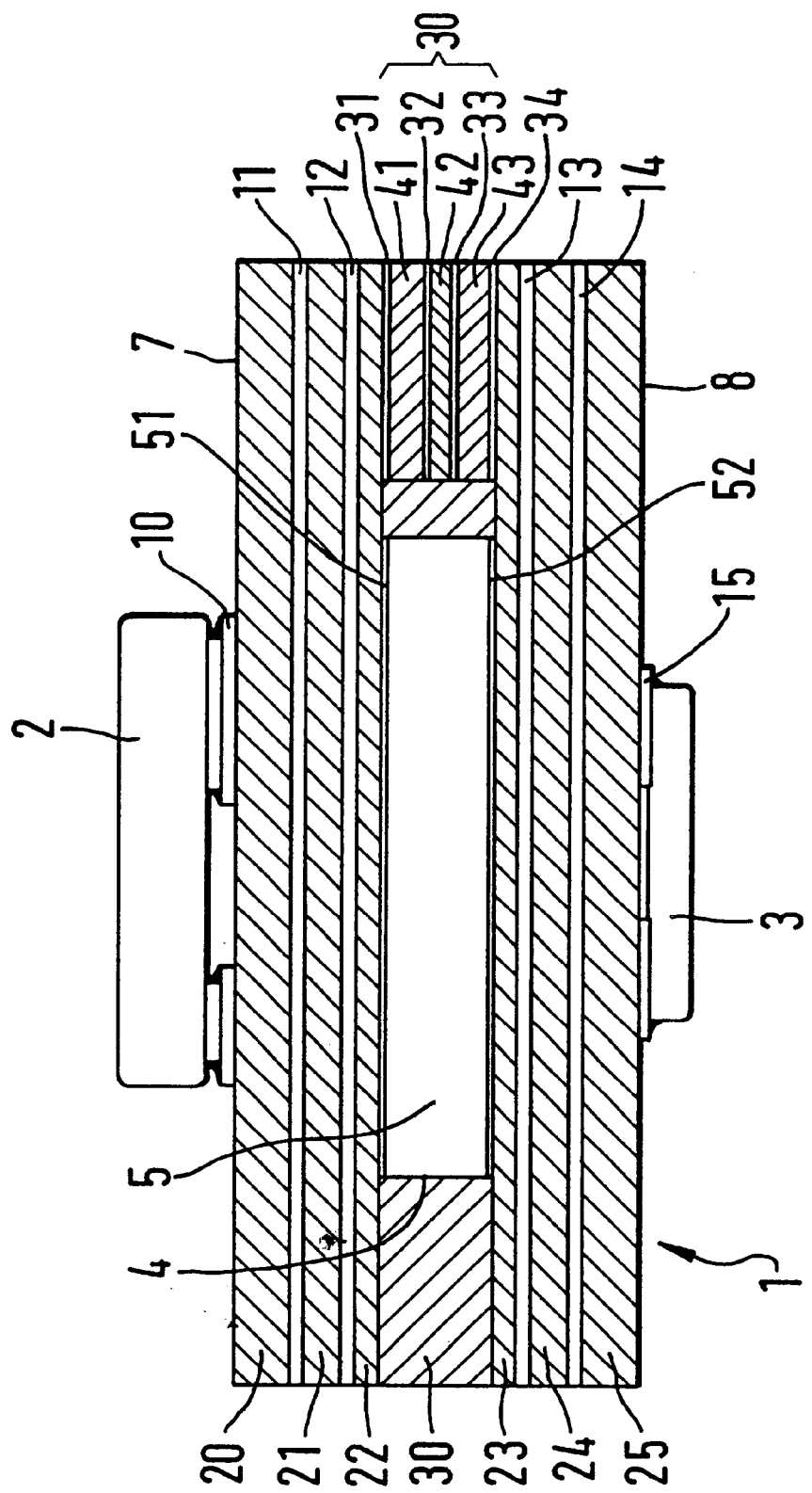
FIG. 1 shows a cross section through a first exemplary embodiment of a multilayer circuit board according to the present invention having a molybdenum core substrate.

FIG. 1 schematically shows a cross section through a first exemplary embodiment of a multilayer circuit board according to the present invention. As is evident from FIG. 1, multilayer circuit board 1 has several insulating material layers 20 through 25 made of epoxy resin, and conductor path planes 10 through 15 in which the conductors paths required for wiring the components are arranged. The conductor paths of the various planes are made of copper, and are partially connected to one another in known fashion via through-plated holes (not depicted) which are passed through the insulating material layers 20 through 25. On upper side 7 of multilayer circuit board 1, a leadless ceramic chip carrier (LCCC) component 2 is soldered directly onto conductor path plane 10. On lower side 8 of multilayer circuit board 1, a further LCCC component 3, which is located approximately opposite component 2 soldered onto the upper side 7, is soldered onto conductor path plane 15.

Dissipation of the heat generated by components 2, 3 can be accomplished via one of the internal copper layers 11, 12 or 13, 14. These copper layers 11, 12 or 13, 14 can therefore have large-area copper conductor paths in order to improve heat dissipation. An inner layer portion 30 is arranged centeredly in the center of multilayer circuit board 1, so that the distance from internal layer portion 30 to upper side 7 is approximately equal to the distance from lower side 8. Layer portion 30 can, as depicted in the left-hand region of FIG. 1, be a single insulating material layer. It is particularly advantageous, however, if layer portion 30, as depicted in the right-hand region of FIG. 1, is itself a multilayer circuit board portion having insulating material layers 41, 42, 43 and further conductor path planes 31, 32, 33, 34.

Inner layer portion 30 furthermore has a core substrate 5 which is introduced as an insert into a recess 4 in layer portion 30 provided therefor, in as accurately fitted a manner as possible. In the exemplary embodiment shown here, core substrate 5 is made of molybdenum. Molybdenum core 5 is equipped on all sides with a black-oxidized copper coating applied by electroplating, of which black-oxidized copper surfaces 51 and 52 facing insulating material layers 22 and 23 are visible in FIG. 1. The black-oxidized copper coating 51, 52 increases adhesion and shear strength, in particular, at the joining surface between the core substrate 5 and insulating material layers 22 and 23. As depicted in FIG. 1, the lateral extent of core substrate 5 is confined approximately to the coverage area of component 2 on upper side 7, and the coverage area of component 3 on lower side 8. In this context, the lateral extent of core substrate 5 can, as is evident from FIG. 1, be expanded somewhat beyond this coverage area. In particular, it is also possible for the lateral extent of the core substrate, as shown in FIG. 3, to be extended over the coverage area of multiple adjacent components 2a through 2e. The dashed lines in FIG. 3, which shows a plan view of a further embodiment of a multilayer circuit board according to the present invention, mark the position of a core substrate 5a and a core substrate 5b, which are both arranged in one plane beneath upper side 7 of circuit board 1. In this exemplary embodiment, the adjacent components 2a and 2e are applied above core substrate 5a. A further ceramic chip carrier component 2f is mounted above the second core substrate 5b, which is arranged in the same inner layer portion 30 in a second recess. Also provided are further components 6 which in order to absorb shear stresses are equipped with elastically deformable connecting leads and therefore do not need to be placed above or below a core substrate 5a, 5b on circuit board 1. The advantageous result of the core substrates 5a, 5b is that in the region equipped with the core substrates 5a, 5b, the high coefficient of thermal expansion of the circuit board material (approx. 15 ppm/K) in the lateral direction is reduced by the relatively low coefficient of thermal expansion of the molybdenum core (approx. 5.3 ppm/K) to an effective expansion coefficient of 6.5 to 7.5 ppm/K, so that the thermal expansion behavior of the multilayer circuit board 1 in the coverage area of the ceramic chip carrier components 2a through 2f is well adapted to the thermal expansion behavior of these components 2a through 2f. As is evident particularly from FIG. 3, core substrates 5a and 5b occupy only a small portion of inner layer portion 30, so that sufficient room is still available to provide further conductor path planes and thus a portion of the conductor path wiring in inner layer portion 30. In particular, this facilitates the production of through-plated holes which pass through the circuit board 1, since they do not need to be passed through the metallic molybdenum core 5, which would require complex production techniques.

The procedure for the production of multilayer circuit board 1 is as follows. First, in known fashion, inner layer portion 30 is produced by stacking two double-sided copper-coated epoxy resin laminates 41 and 43, which are pressed together under vacuum and cured by way of an interposed prepreg layer 42 also being made of epoxy resin. The production of conductor paths in copper layers 31, 32, 33, and 34 (also called conductor path planes) can be accomplished, in known fashion, by coating the individual laminates 41 and 43 with photoresist and subsequently etching them. Conductor path planes 31 through 34 do not extend through the entire inner layer portion 30. At a location in inner layer portion 30 that is not equipped with conductor paths, a continuous recess 4 is milled out of the layer portion 30. A core substrate 5 is then placed into recess 4. In the exemplary embodiment shown here, core substrate 5 is a molybdenum core having a rectangular cross section, which is equipped on all sides with a galvanically applied black-oxidized copper coating 51, 52. Recess 4 is fabricated with a certain tolerance, so that the molybdenum core 5 can be placed into recess 4 of inner layer portion 30 without forcing. Inner layer portion 30 is arranged in a stack with further epoxy resin laminates 20 through 25 and adhesive films. Epoxy resin laminates 20 through 25 are already equipped in layers 10 through 15 with conductor paths, which are produced in known fashion by photoprinting and subsequent etching, and black-oxidization of the copper layers 31, 32, 33, and 34. The entire stack is then vacuum-pressed. During pressing, liquefied epoxy resin from the prepreg films penetrates into the gaps between core substrate 5 and recess 4, creating a tight-fitting join. Through-plated holes are then produced in known fashion in the multilayer circuit board by drilling through the circuit board and metallizing the inner walls of the drill holes.

In a further exemplary embodiment of the present invention, provision is made for core substrate 5 shown in FIG. 1 to be configured as a carbon fiber core. The layer structure shown in FIG. 1 is otherwise retained. The structure of the carbon fiber core is depicted in FIG. 2. The carbon fiber core comprises unidirectional carbon fiber plies (UD plies) which each have a plurality of carbon fibers, approximately 5 micrometers thick and arranged in parallel fashion, which are embedded in epoxy resin and form partially cured prepregs 100 to 125 micrometers thick. These prepregs are pressed in vacuum in a press, under the action of pressure and heat, to form the carbon fiber core. Copper foils are simultaneously laminated onto the outer layers during pressing. The specific layer structure of the core depicted in FIG. 2 has particular advantages. The core comprises four unidirectional plies 60, 61, 62, and 63. Carbon fibers 70 in the two center plies 61 and 62 run in the same direction and parallel to one another, while carbon fibers 70 in the outer plies 60 and 63 are oriented at a 90-degree offset to the carbon fibers in the center plies. The outer carbon fiber plies 60 and 63 are equipped with copper coatings 51 and 52. The structure of the carbon fiber core depicted here has the advantage that after pressing, the core does not either bulge or warp, but rather retains its planarity. This is attributable to the fact that the mechanical stresses are of equal magnitude on both outer sides of the core.

What is claimed is:

1. A multilayer circuit board having a first outer side and a second outer side, comprising:
   a plurality of insulating material layers including at least a first outer insulating material layer and a second outer insulating material layer;
   a plurality of conductor path planes extending in a direction parallel to the plurality of insulating material layers and arranged one above another and being separated from each other by the plurality of insulating material layers;
   at least one electronic component situated on one of the first outer side and the second outer side;
   at least one core substrate arranged between the first outer insulating material layer and the second outer insulating material layer, the at least one core substrate adapting a plurality of thermal expansion properties of the multilayer circuit board, at least in a coverage area of the at least one electronic component, to a plurality of thermal expansion properties of the at least one electronic component; and
   an inner layer portion having a recess, the inner layer portion being situated between the first outer insulating material layer and the second outer insulating material layer, and including printed circuit traces which extend in a direction parallel to the first outer insulating material layer and the second outer insulating material layer, the recess having a lateral extent confined substantially to the coverage area of the at least one electronic component, wherein the at least one core substrate is arranged within the recess.

2. The multilayer circuit board according to claim 1, wherein the at least one electronic component includes an LCCC component.

3. The multilayer circuit board according to claim 1, wherein the at least one core substrate is arranged in the recess in a tight-fitting manner.

4. The multilayer circuit board according to claim 1, wherein the inner layer portion is arranged according to a centered orientation between the first outer insulating material layer and the second outer insulating material layer.

5. The multilayer circuit board according to claim 1, wherein the at least one core substrate includes a molybdenum core.

6. The multilayer circuit board according to claim 1, wherein the at least one core substrate includes a carbon fiber core containing a plurality of unidirectional carbon fiber plies arranged one above another.

7. The multilayer circuit board according to claim 1, further comprising a metal coating applied at least onto each outer side of the at least one core substrate facing a corresponding one of the plurality of insulating material layers.

8. The multilayer circuit board according to claim 7, wherein the metal coating includes copper.

9. The multilayer circuit board according to claim 7, wherein the metal coating includes a black-oxidized copper coating.

10. A multilayer circuit board having a first outer side and a second outer side, comprising:
    a plurality of insulating material layers including at least a first outer insulating material layer and a second outer insulating material layer;
    a plurality of conductor path planes arranged one above another and being separated from each other by the plurality of insulating material layers;
    at least one electronic component situated on one of the first outer side and the second outer side;
    at least one core substrate arranged between the first outer insulating material layer and the second outer insulating material layer, the at least one core substrate adapting a plurality of thermal expansion properties of the multilayer circuit board, at least in a coverage area of the at least one electronic component, to a plurality of thermal expansion properties of the at least one electronic component; and an inner layer portion having a recess, being situated between the first outer insulating material layer and the second outer insulating material layer, and including printed circuit traces, the recess having a lateral extent confined substantially to the coverage area of the at least one electronic component, wherein the at least one core substrate is arranged within the recess;

wherein the inner layer portion includes a second plurality of conductor path planes and a second plurality of insulating material layers for separating the second plurality of conductor path planes from each other.

11. A multilayer circuit board having a first outer side and a second outer side, comprising:

a plurality of insulating material layers including at least a first outer insulating material layer and a second outer insulating material layer;

a plurality of conductor path planes extending in a direction parallel to the plurality of insulating material layers and arranged one above another and being separated from each other by the plurality of insulating material layers;

at least one electronic component situated on one of the first outer side and the second outer side;

at least one core substrate arranged between the first outer insulating material layer and the second outer insulating material layer, the at least one core substrate adapting a plurality of thermal expansion properties of the multilayer circuit board, at least in a coverage area of the at least one electronic component, to a plurality of thermal expansion properties of the at least one electronic component; and an inner layer portion having a recess, the inner layer portion being situated between the first outer insulating material layer and the second outer insulating material layer, and including printed circuit traces which extend in a direction parallel to the first outer insulating material layer and the second outer insulating material layer, the recess having a lateral extent confined substantially to the coverage area of the at least one electronic component, wherein the at least one core substrate is arranged within the recess;

wherein the at least one core substrate includes a carbon fiber core containing a plurality of unidirectional carbon fiber plies arranged one above another; and wherein the carbon fiber core includes four unidirectional carbon fiber plies of identical thickness, wherein the four unidirectional carbon fiber plies include two center carbon fiber plies and two outer carbon fiber plies, and wherein the two center carbon fiber plies include carbon fibers that are parallel to each other and are displaced according to a 90-degree offset from carbon fibers of the two outer carbon fiber plies.

* * * * *